United States Patent [19]

Tischer

[11] 4,238,685
[45] Dec. 9, 1980

[54] ARRANGEMENT FOR THE PRODUCTION OF ELECTRONIC SEMICONDUCTOR COMPONENTS

[75] Inventor: Peter Tischer, Strasslach, Fed. Rep. of Germany

[73] Assignee: Siemens Aktiengesellschaft, Berlin & Munich, Fed. Rep. of Germany

[21] Appl. No.: 66,849

[22] Filed: Aug. 15, 1979

[30] Foreign Application Priority Data

Sep. 21, 1978 [DE] Fed. Rep. of Germany ....... 2841124

[51] Int. Cl.³ .................. H01L 21/263; H01L 21/308
[52] U.S. Cl. .................................. 250/492 A; 29/579; 250/491
[58] Field of Search .............. 250/492 A, 491; 29/579

[56] References Cited

U.S. PATENT DOCUMENTS

| | | | |
|---|---|---|---|
| 3,742,229 | 6/1973 | Smith et al. | 250/492 A |
| 3,743,842 | 7/1973 | Smith et al. | 250/492 A |
| 3,984,680 | 10/1976 | Smith | 250/492 A |
| 4,169,230 | 9/1979 | Bohlen et al. | 250/492 A |

FOREIGN PATENT DOCUMENTS 2333902 2/1976 Fed. Rep. of Germany.

OTHER PUBLICATIONS

Baskish, R., "Progress in X-ray Lithography," *Electron and Ion Beam Science and Technology*, Electrochem. Soc., Princeton, 1974, pp. 3-22.

*Primary Examiner*—Alfred E. Smith
*Assistant Examiner*—T. N. Grigsby
*Attorney, Agent, or Firm*—Hill, Van Santen, Steadman, Chiara & Simpson

[57] ABSTRACT

The disclosure pertains to alignment procedure applicable in the case of x-ray lithography which is to be effected with the help of a mask which is arranged between the semiconductor body and the radiation source. The disclosure is characterized by a fixed association of the mask with respect to the semiconductor body during alignment and a relative displacement of the source location of the x-ray beam with respect to the mask and semiconductor body for example by bodily movement of the x-ray source components. With this system, by displacement of the radiation beam at its source end by the order of millimeters one can obtain an effective adjustment of the mask with respect to the substrate of the order of approximately 0.1 $\mu$m.

2 Claims, 1 Drawing Figure

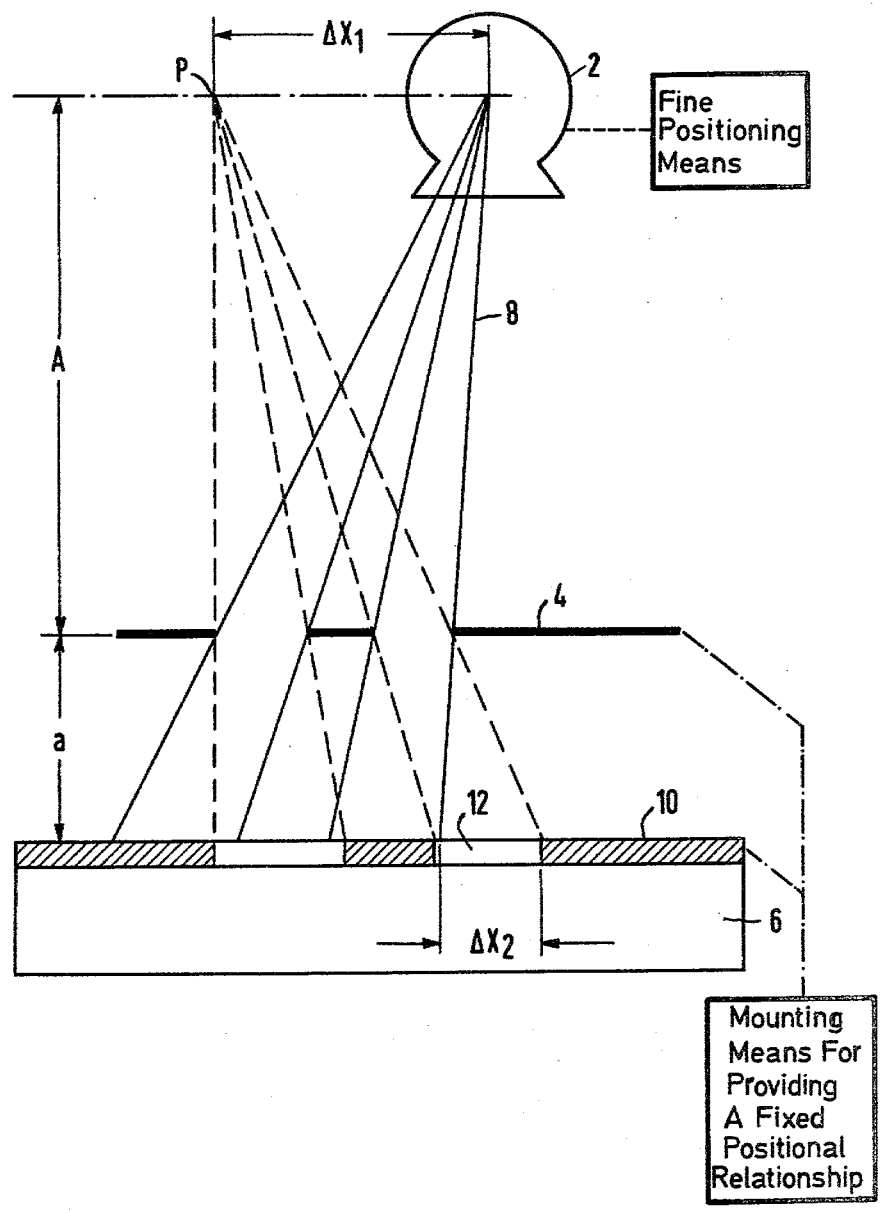

ARRANGEMENT FOR THE PRODUCTION OF ELECTRONIC SEMICONDUCTOR COMPONENTS

BACKGROUND OF THE INVENTION

The invention concerns an arrangement for the production of electronic semiconductor components with predetermined surface structure, in particular integrated switching circuits, by means of Roentgen lithography with the help of a mask arranged between the semiconductor body and the x-ray source.

From the German Auslegeschrift No. 2,333,902, a system for the alignment of a mask with respect to a substrate is known, in the case of which alignment marks, which are associated to one another and matched to each other in each case, are arranged on the mask and on the substrate. Further, means for the alignment are provided by means of the evaluation of the relative position of the marks which are associated to one another. For determination of the deviation of the alignment of the substrate and the mask which is laid directly upon it, a soft x-ray which penetrates both is used. The adjustment marks are impenetrable in partial areas for these x-rays. For determination of the x-rays which penetrate the mask and the substrate, a detector is provided. The system contains a piezoelectric positioning device, which displaces the mask and the substrate opposite one another. In dependence upon the x-ray which in the area of the adjustment marks penetrates the mask and the substrate, the mask and substrate are moved such that the alignment marks are covered. This system is relatively inconvenient. Besides this, the movement by means of piezo ceramic bodies is known to be affected with hysteresis.

It is further known that the mask can also be arranged at a slight distance above the surface of the semiconductor substrate to be processed (McCoy and Sullivan "Progress in X-ray Lithography", in *Electron and Ion Beam Science and Technology* edited by R. Baskish The Electrochemical Society, Princeton/USA, 1974, pages 3 through 22). For the alignment of the mask in relation to the substrate, also a piezoelectrical positioning device is provided for fine adjustment of the mask, which contains four piezoelectric cylinders. In each case, two cylinders which are moveable in the same sense are provided for the adjustment in x-direction, or, respectively, in y-direction. If in each case two cylinders are moved oppositely, then the mask carries out a rotation. The arrangement contains an amplifier which is postarranged to the piezoelectric cylinders and electronic switches as well as a digital-analog converter and further in each case a digital phase discriminator. What is disadvantageous in this arrangement is the hysteresis in the movement of the mask through the piezoelectrical cylinders. Besides this, in this known device, the influence of the surface roughness upon the adjustment cannot be excluded.

SUMMARY OF THE INVENTION

The invention is based upon the problem of designing an arrangement for the production of semiconductor components with predetermined surface structure by means of x-ray lithography such that a positioning of the mask pattern with respect to the substrate is possible in the area of approximately one-tenth micron (0.1 μm).

This problem is solved according to the invention by means of a rigid association of the mask with respect to the semiconductor body and a relative displacement of the x-ray source to the unit of mask and semiconductor body. Through the movement of the x-ray source in the area of millimeters, one obtains a corresponding adjustment of the mask in relation to the substrate in the area of 0.1 μm and less. A fine positioning of the mask in relation to the substrate is besides this possible by the procedure that in the case of a fixed ray source, the mask and the semiconductor body are displaced together laterally.

For further explanation of the invention, reference is made to the accompanying sheet of drawing, in which an arrangement according to the invention is schematically visualized; and other objects, features and advantages will be apparent from this detailed disclosure and from the appended claims.

BRIEF DESCRIPTION OF THE DRAWING

The single FIGURE is a schematic sectional view for illustrating an embodiment in accordance with the invention.

DETAILED DESCRIPTION

In the FIGURE, an x-ray source is designated with 2, a mask with 4, and the semiconductor body of an electronic component with 6. The x-ray source 2 delivers soft x-rays 8 with a wavelength of for example approximately 5 to 15 Å. They can preferably be provided with an aluminum anode, which produces an x-ray beam 8 with a wavelength of 8.34 Å. The x-ray beam 8 penetrates the nonabsorbing parts of the mask 4, which in the FIGURE is simply indicated as having open windows. The mask 4 is designed in the known manner and contains a substrate, for example, out of silicon doped with boron, which substrate is thinly etched upon its underflat side and upon its upper flat side with a protective film, for example, out of silicon dioxide $SiO_2$. On the protective film then, a thin absorbing layer is arranged, which for example, can consist of gold or copper and which can be produced in the known photo resist technology. Over the mask 4, in general also a radiation shield is arranged, which is not represented in the FIGURE, which for example, can consist of aluminum foil and at the same time serves as filter for hard x-rays. The x-ray source 2 is arranged at distance A, for example 50 centimeters, above the mask 4, which is located at a significantly lesser distance a of for example, approximately fifty microns (50 μm) above the semiconductor body 6. The semiconductor body 6 is provided on its upper flat side with a protective film 10, which, for example, consists of silicon oxide SiO or silicon dioxide $SiO_2$ and is provided with windows 12. With these windows 12, the protective film 10 forms a predetermined pattern, according to which the mask 4 must be aligned.

A solution according to the invention now consists herein, that for fine positioning of the mask 4 with respect to the semiconductor body 6, the x-ray source 2 is displaced according to its large distance A over the mask 4 over a relatively large path $\Delta X_1$ to the point P parallelly to the surface of the semiconductor body 6. With this, the point of impact of the x-ray beam 8 upon the surface of the protective film 10 is displaced along the correspondingly lesser path $\Delta X_2$. The mechanical displacement of the x-ray source 2 carries over thus in the relationship of the distances a/A. The change of the point of impact of the x-rays 8 upon the protective film 10 results thus $$\Delta X_2 = (a/A) \cdot \Delta X_1.$$

With the distance $a = 50$ μm and a distance $A = 50$ centimeters, one obtains, with a displacement of the x-ray source 2 along the path $X_1 = 1$ millimeter a change of the point of impact of the x-rays 8 upon the protective film 10 of $\Delta X_2 = 0.1$ μm.

A further solution consists therein, that instead of the x-ray source 2, the mask 4 and the semiconductor body 6 together, that is, as constructive unit, are displaced laterally with respect to the x-ray source 2. Also in this embodiment form of the fine positioning, a displacement of the mask 4 with respect to the semiconductor body 6 is not necessary.

It is further possible not to mechanically displace the x-ray source 2 itself, but rather to provide a suited diversion system, for example, by means of a magnetic or electrical field, for the electrons which generate the x-rays in front of the anode of the x-ray source, and with this to displace the location of origin of the x-rays.

For the sake of the illustration in the FIGURE, only the portion of the beam 8 which is transmitted by the mask 4 is actually indicated, for each position of the beam. The fine positioning means 14 may represent means for holding both mask 4 and semiconductor body 6 absolutely stationary while the source 2 is shifted a distance $\Delta X_1$ along a parallel path so that its lithographically effective pattern transmitted through mask 4 to the surface of semiconductor body is shifted by a distance $\Delta X_2$.

The fine positioning means 14 may also represent electron influencing field adjusting means for incrementally shifting the point of impingement of an electron beam on an anode so as to shift the focal spot by the distance $\Delta X_1$ without a shifting of the cathode or anode. The same field is then effective in controlling the x-ray beam direction during the lithographic process.

It will be apparent that many modifications and variations may be effected without departing from the scope of the novel concepts and teachings of the present invention.

I claim as my invention:

1. An arrangement comprising an x-ray source for the production of electronic semiconductor components with predetermined surface structure, in particular, integrated switching circuits, by means of x-ray lithography, wherein a mask is arranged between a semiconductor body and the x-ray source, characterized by
    (a) means providing a fixed association of the mask (4) with respect to the semiconductor body (6); and
    (b) means providing for relative displacement of the x-ray source (2) with respect to said mask (4) and said semiconductor body (6) while said mask and said semiconductor body remain in said fixed association.

2. An arrangement comprising an x-ray source with a shiftable electron path, for the production of electronic semiconductor components with predetermined surface structure, in particular integrated switching circuits, by means of x-ray lithography, wherein a mask is arranged between the semiconductor body and the x-ray source, said arrangement further comprising:
    (a) means providing a fixed association of the mask (4) with respect to the semiconductor body (6); and
    (b) a diversion system for the electrons in front of the anode of the x-ray source (2) to shift the source location of the x-ray beam and thereby to adjust the effective position of the mask (4) relative to the semiconductor body (6) without any actual movement of the mask relative to the semiconductor body.

* * * * *